United States Patent
Zhou et al.

(10) Patent No.: US 10,115,786 B2
(45) Date of Patent: Oct. 30, 2018

(54) CAPACITOR AND METHOD FOR FABRICATING THE SAME

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW); Chen-Bin Lin, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 4 days.

(21) Appl. No.: 15/352,551

(22) Filed: Nov. 15, 2016

(65) Prior Publication Data

US 2017/0170257 A1    Jun. 15, 2017

Related U.S. Application Data

(62) Division of application No. 14/967,344, filed on Dec. 13, 2015, now Pat. No. 9,530,834.

(51) Int. Cl.
*H01L 49/02* (2006.01)
*H01G 11/24* (2013.01)

(52) U.S. Cl.
CPC .................................. *H01L 28/91* (2013.01)

(58) Field of Classification Search
CPC ...................................................... H01L 28/92
USPC .......... 257/300–310; 438/253–256, 397–399
See application file for complete search history.

(56) References Cited

U.S. PATENT DOCUMENTS

| | | | | |
|---|---|---|---|---|
| 5,116,776 A | * | 5/1992 | Chan | H01L 27/10817 257/E21.008 |
| 5,137,842 A | * | 8/1992 | Chan | H01L 27/10817 257/E21.016 |
| 5,164,337 A | * | 11/1992 | Ogawa | H01L 21/31111 148/DIG. 14 |
| 5,177,574 A | * | 1/1993 | Yoneda | H01L 27/10817 257/306 |
| 5,783,848 A | * | 7/1998 | Chao | H01L 27/10817 257/296 |
| 5,793,076 A | | 8/1998 | Fazan | |
| 5,950,084 A | * | 9/1999 | Chao | H01L 27/10808 257/E21.648 |
| 6,037,206 A | | 3/2000 | Huang et al. | |
| 6,046,092 A | * | 4/2000 | Chang | H01L 28/91 257/E21.019 |
| 6,096,597 A | | 8/2000 | Tsu et al. | |
| 6,635,523 B1 | | 10/2003 | Uchiyama et al. | |
| 7,059,041 B2 | | 6/2006 | Behammer | |
| 7,105,405 B2 | | 9/2006 | Schuegraf | |
| 8,085,524 B2 | * | 12/2011 | Roozeboom | H01L 27/0805 361/301.2 |

\* cited by examiner

*Primary Examiner* — Nishath Yasmeen
(74) *Attorney, Agent, or Firm* — Winston Hsu

(57) ABSTRACT

A capacitor includes: a bottom electrode; a middle electrode on the bottom electrode; a top electrode on the middle electrode; a first dielectric layer between the bottom electrode and the middle electrode; and a second dielectric layer between the middle electrode and the top electrode. Preferably, the second dielectric layer is disposed on at least a sidewall of the middle electrode to physically contact the first dielectrically, and the middle electrode includes a H-shape.

9 Claims, 5 Drawing Sheets

CAPACITOR AND METHOD FOR FABRICATING THE SAME

CROSS REFERENCE TO RELATED APPLICATIONS

This application is a division of U.S. application Ser. No. 14/967,344 filed Dec. 13, 2015, and incorporated herein by reference in its entirety.

BACKGROUND OF THE INVENTION

1. Field of the Invention

The present invention relates to a method for fabricating a capacitor, and more particularly, to a method for fabricating a metal-insulator-metal capacitor.

2. Description of the Prior Art

Use of and interest in merged memory and logic semiconductor devices is increasing. A merged memory and logic device is a structure where a memory, such as a DRAM, and a logic, such as a logic circuit, are implemented in a single chip. Implementation of a memory and logic in a single chip in a merged memory and logic semiconductor device is advantageous over conventional chips as high-speed and low-power driving is possible without any particular change in design. Furthermore, merged memory and logic semiconductor devices may include a number of common hardware devices including capacitors.

Capacitors are elements that are used extensively in semiconductor devices for storing an electrical charge. Capacitors essentially comprise two conductive plates separated by an insulator. The capacitance, or amount of charge held by the capacitor per applied voltage, depends on a number of parameters such as the area of the plates, the distance between the plates, and the dielectric constant value of the insulator between the plates, as examples. Capacitors can be used in filters, analog-to-digital converters, memory devices, control applications, and many other types of semiconductor devices.

One type of capacitor is a metal-insulator-metal (MIM) capacitor, which is frequently used in mixed signal devices and logic semiconductor devices, as examples. MIM capacitors are used to store a charge in a variety of semiconductor devices. MIM capacitors are often used as storage nodes in a memory device, for example. A MIM capacitor is typically formed horizontally on a semiconductor wafer, with two metal plates sandwiching a dielectric layer parallel to the wafer surface. Therefore, MIM capacitors have often been referred to as thin-film capacitors. As a result, it is difficult to manufacture MIM capacitors which have a relatively large capacitance per unit area.

Furthermore, conventional MIM capacitors have low breakdown voltages and typically are not suitable to be used in high voltage applications, for example, greater than 2.5V. As a result, a need exists for embedded MIM capacitors capable of handling higher voltage applications with larger breakdown voltage tolerances.

SUMMARY OF THE INVENTION

According to a preferred embodiment of the present invention, a method for fabricating capacitor is disclosed. The method includes the steps of: providing a material layer; forming a patterned first conductive layer on the material layer, forming a first dielectric layer on the patterned first conductive layer; forming a second conductive layer and a cap layer on the first dielectric layer; removing part of the cap layer to form a spacer on the second conductive layer; and using the spacer to remove part of the second conductive layer for forming a trench above the patterned first conductive layer and fin-shaped structures adjacent to the trench.

According to another aspect of the present invention, a capacitor is disclosed. The capacitor includes: a bottom electrode; a middle electrode on the bottom electrode, in which the middle electrode comprises a H-shape; and a top electrode on the middle electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
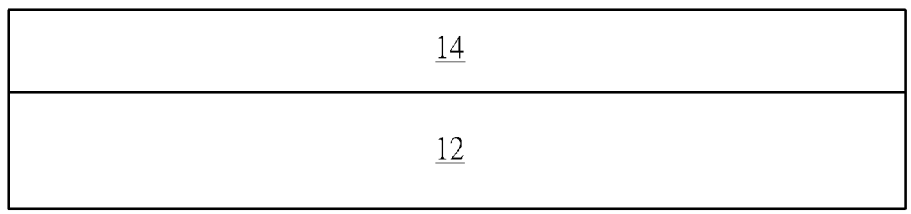
FIGS. 1-10 illustrate a method for fabricating capacitor according to a preferred embodiment of the present invention.

Referring to FIGS. 1-10, FIGS. 1-10 illustrate a method for fabricating capacitor according to a preferred embodiment of the present invention. As shown in FIG. 1, a material layer 12 is first provided, in which the material layer 12 could be a semiconductor substrate or an interlayer dielectric (ILD) layer or inter-metal dielectric (IMD) layer on the semiconductor substrate. If the material layer 12 were to be a semiconductor substrate, the material layer 12 is preferably composed of silicon, whereas if the material layer 12 were to be a ILD layer or IMD layer disposed on a semiconductor substrate, the material layer 12 is preferably composed of insulating material such as silicon dioxide.

Next, a first conductive layer 14 is deposited on the material layer 12, in which the first conductive layer 14 could be selected from the group consisting of W, Ti, TiN, Ta, TaN, and Al, but not limited thereto.

Figure 2:
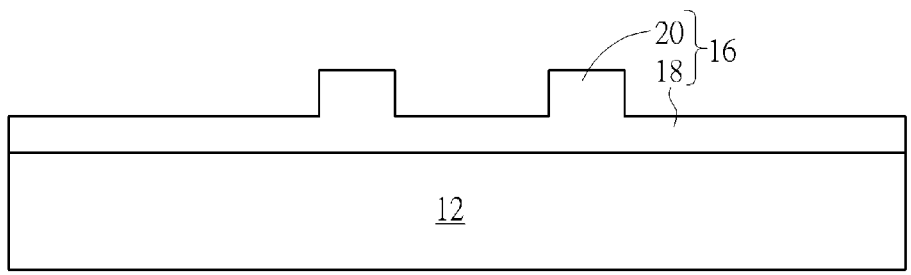

Next, as shown in FIG. 2, a photo-etching process is conducted by first forming a patterned mask (not shown) on the first conductive layer 14, and an etching process is performed to remove part of the first conductive layer 14 not covered by the patterned resist to form a patterned first conductive layer 16. The patterned first conductive layer 16 is preferably serving as a bottom electrode of the capacitor of the present invention. The patterned mask is stripped thereafter.

Preferably, the patterned first conductive layer 16 includes a planar portion 18 and two protruded portions 20 on or protruded from the planar portion 18. It should be noted that even though two protruded portions are disclosed in this embodiment, the quantity of the protruded portions 20 could be adjusted according to the demand of the product.

Figure 3:
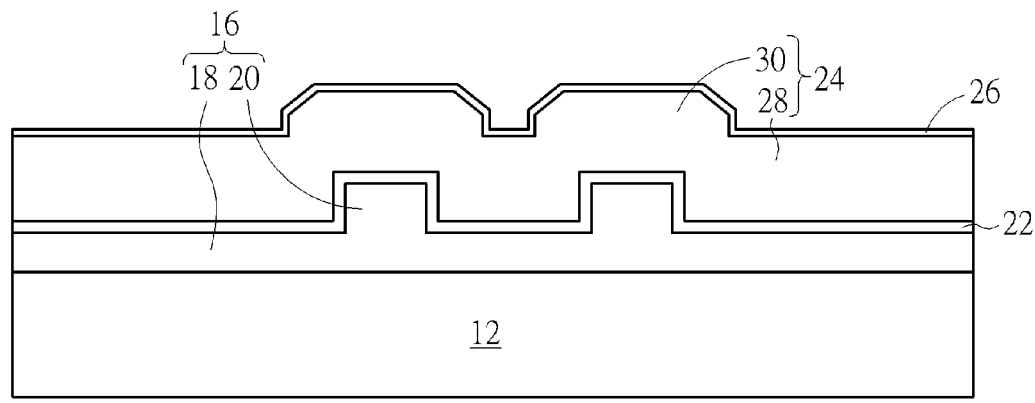

Next, as shown in FIG. 3, a first dielectric layer 22, a second conductive layer 24, and a cap layer 26 are formed sequentially on the patterned first conductive layer 16. Preferably, the first dielectric layer 22, the second conductive layer 24, and the cap layer 26 are conformally formed on the patterned first conductive layer 16 so that the profile of the first dielectric layer 22, the second conductive layer 24, and the cap layer 26 would resemble the profile of the planar portion 18 and protruded portions 20 of the patterned first conductive layer 16. After the deposition of the layers 22, 24, 26, the second conductive layer 24 in particular also reveals planar portion 28 and protruded portions 30 in resemblance to the protruded portions 20 and planar portion 18 of the patterned first conductive layer 16.

In this embodiment, the second conductive layer 24 and the patterned first conductive layer 16 could be composed of same material or different material. For instance, the second conductive layer 24 could be selected from the group consisting of W, Ti, TiN, Ta, TaN, and Al, but not limited thereto. The first dielectric layer 22 and the cap layer 26 could be composed of same material or different material, in which the first dielectric layer 22 and the cap layer 26 could be selected from the group consisting of oxide-nitride-oxide (ONO), silicon nitride (SiN), silicon oxide ($SiO_2$), and silicon oxynitride (SiON).

According to an embodiment of the present invention, the first dielectric layer 22 and the cap layer 26 could also be a high-k dielectric layer selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

It should also be noted that instead of conducting the photo-etching process to remove part of the first conductive layer 14 without exposing the material layer 12 underneath as revealed in FIG. 2, it would also be desirable to conduct the same photo-etching process to remove part of the first conductive layer 14 to form a patterned first conductive layer while exposing part of the material layer 12 surface underneath. In this instance, the first dielectric layer 14 would be deposited not only on the patterned first conductive layer 16 but also contacting the exposed material layer 12 directly, which is also within the scope of the present invention.

Figure 4:
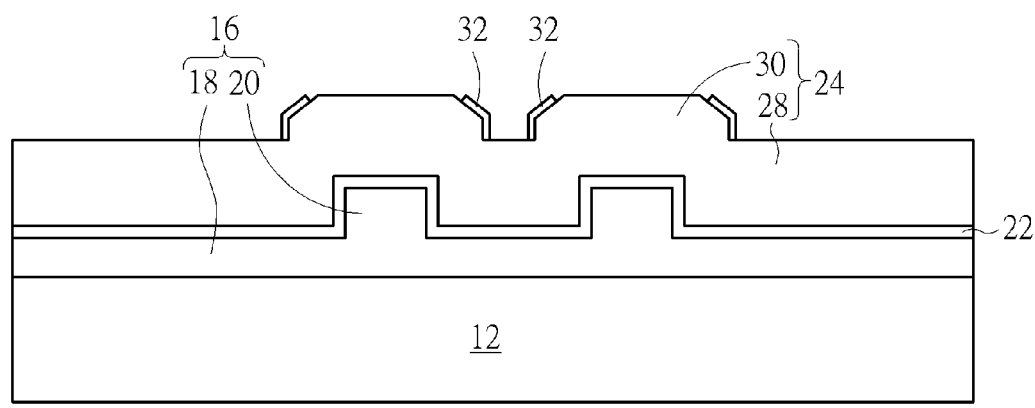

Next, as shown in FIG. 4, part of the cap layer 26 is removed to form spacers 32 on the second conductive layer 24. Preferably, the formation of the spacers 32 could be accomplished by conducting an etching process using fluorine-based etchant to remove part of the cap layer 26 directly on top of the protruded portions 30 of the second conductive layer 24 and part of the cap layer 26 adjacent to two sides of the protruded portions 30. This forms spacers 32 adjacent to each of the protruded portions 30 of the second conductive layer 24 while the top surface of the protruded portions 30 and the top surface of planar portion 28 are exposed.

Figure 5:
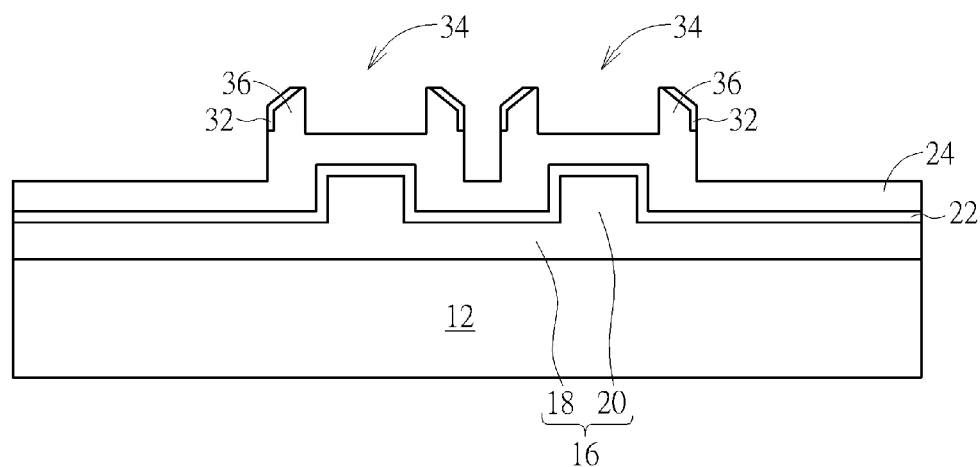

Next, as shown in FIG. 5, another etching process is conducted by using the spacers 32 as mask to remove part of the second conductive layer 24 for forming trenches 34 and fin-shaped structures 36 above the patterned first conductive layer 16. Specifically, the etching process is accomplished by using a chlorine-based etchant to remove part of the second conductive layer 24 not covered by the spacers 32 to form the trenches 34 and fin-shaped structures 36 adjacent to the trenches 34 while the overall thickness of the second conductive layer 24 is also reduced. Preferably, each of the trenches 34 is formed directly above the protruded portion 20 of the patterned first conductive layer 16 while the fin-shaped structures 36 are formed adjacent to sides of each trench 34. The second conductive layer 24 along with the fin-shaped structures 36 is preferably serving as a middle electrode of the capacitor of this embodiment.

Figure 6:
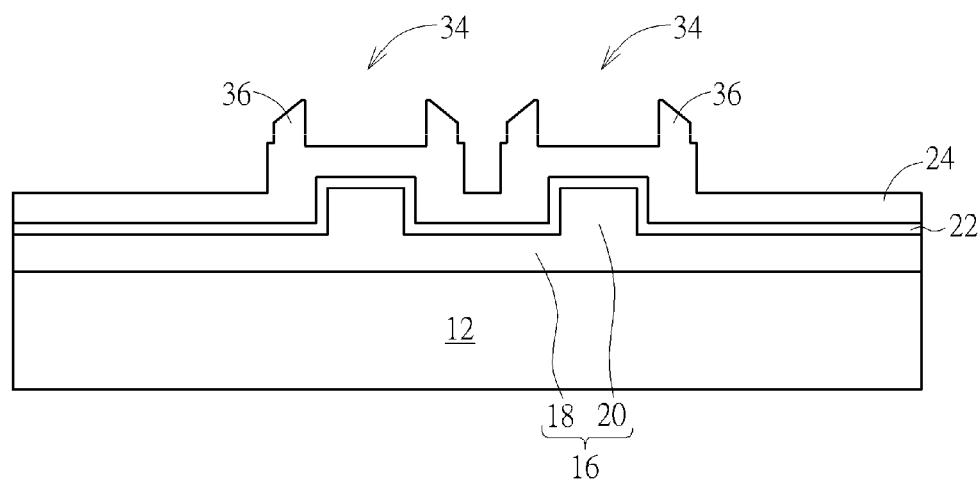

Next, as shown in FIG. 6, an etching back process is conducted to remove the spacers 32 from the top of the fin-shaped structures 36, in which the etching back process is preferably accomplished by using high selectivity etchant such as a fluorine-based etchant, but not limited thereto.

Figure 7:
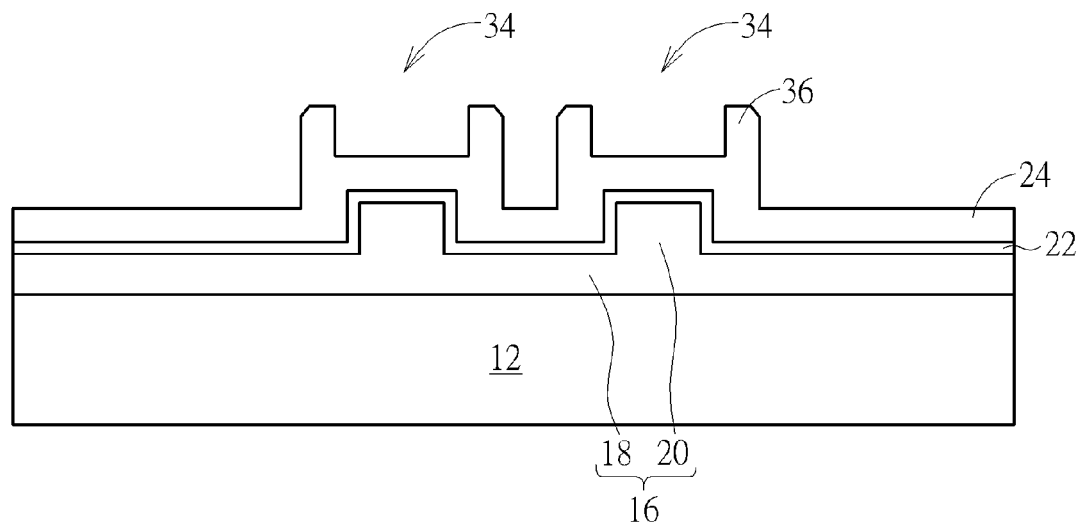

Next, as shown in FIG. 7, another etching process, preferably an isotropic etching is conducted to trim the fin-shaped structures 36 adjacent to the trenches 34 so that the top surface of the fin-shaped structures 36 become substantially planar while the width of the fin-shaped structures 36 could also be reduced slightly.

Figure 8:
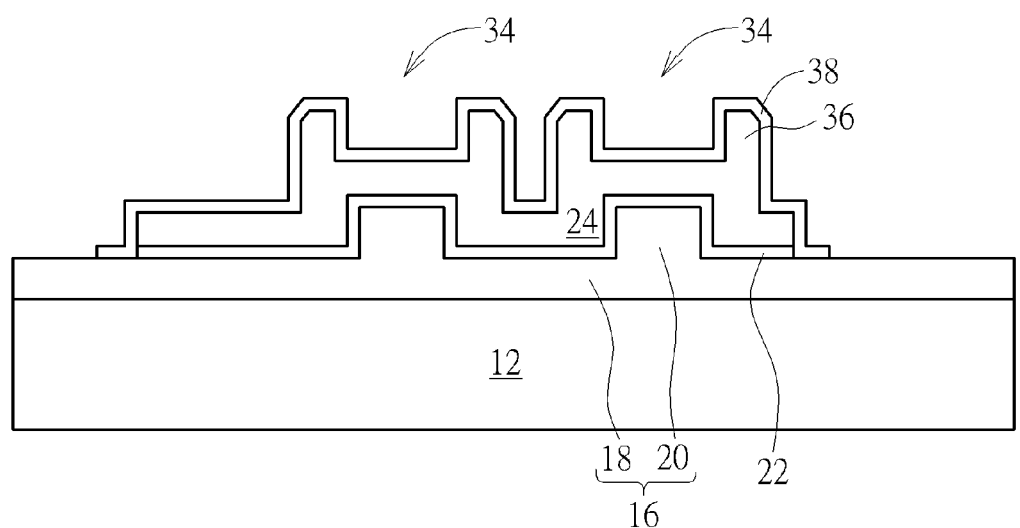

Next, as shown in FIG. 8, a photo-etching process could be conducted to remove part of the second conductive layer 24 and part of the first dielectric layer 22 to expose part of the top surface of the patterned first conductive layer 16. A second dielectric layer 38 is then deposited on the top surface and sidewalls of the second conductive layer 24, the sidewalls of the first dielectric layer 22, and the top surface of the patterned first conductive layer 16. Preferably, the second dielectric layer 38 and the first dielectric layer 22 could be composed of same material or different material. For instance, the second dielectric layer 38 could be selected from the group consisting of oxide-nitride-oxide (ONO), silicon nitride (SiN), silicon oxide ($SiO_2$), and silicon oxynitride (SiON), or could be composed of high-k dielectric material as disclosed above. Next, another photo-etching process could be conducted to remove part of the second dielectric layer 38 so that part of the top surface of patterned first conductive layer 16 is exposed.

Figure 9:
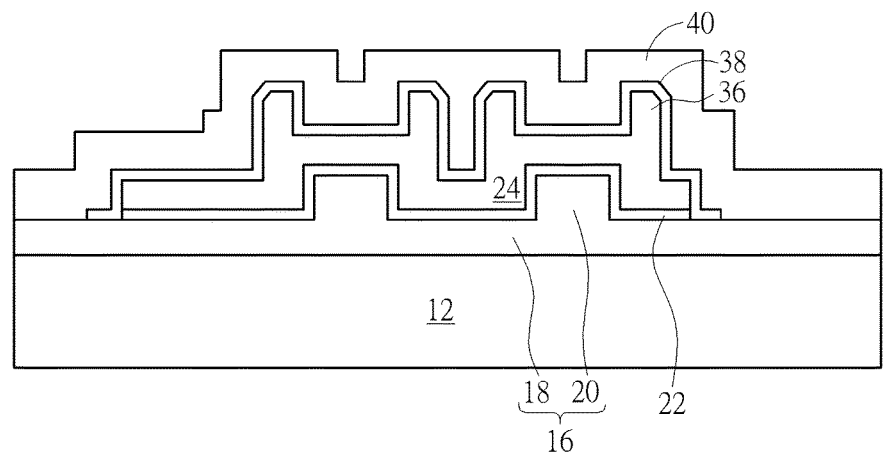

Next, as shown in FIG. 9, a third conductive layer 40 serving as a top electrode of the capacitor is formed on the second dielectric layer 38 and the exposed patterned first conductive layer 16. Since part of the top surface of patterned first conductive layer 16 is exposed when part of the second dielectric layer 38 is removed in FIG. 8, the third conductive layer 40 formed on the second dielectric layer 38 preferably contacts the patterned first conductive layer 16 or bottom electrode directly. Preferably, the third conductive layer 40 and the patterned first conductive layer 16 could be composed of same material or different material. For instance, the third conductive layer 40 could be selected from the group consisting of W, Ti, TiN, Ta, TaN, and Al, but not limited thereto.

Figure 10:
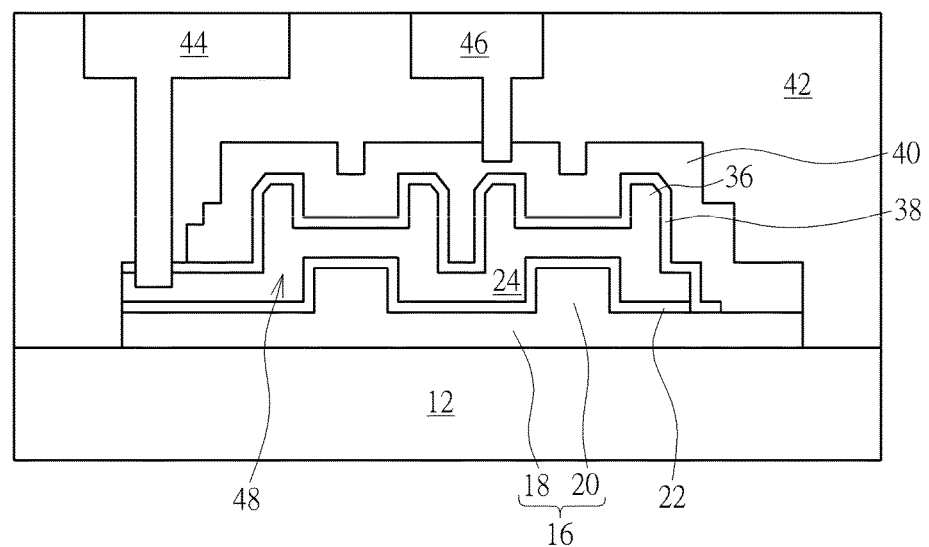

Next, as shown in FIG. 10, a photo-etching process could be conducted to remove part of the third conductive layer 40 and part of the patterned first conductive layer 16 for defining the size and dimension of the capacitor, and another etching process is conducted thereafter to remove part of the third conductive layer 40 for exposing part of the top surface of second dielectric layer 38. Next, another material layer 42 is formed on the third conductive layer 40 and the material layer 12, in which the material layer 42 is preferably a IMD layer composed of insulating material such as silicon dioxide, but not limited thereto. After the material layer 42 is deposited, a plurality of contact plugs 44 and 46 could be formed in the material layer 42 to physically connect and contacting the second conductive layer 24 (or middle electrode) and third conductive layer 40 (or top electrode) individually. This completes the fabrication of a capacitor according to a preferred embodiment of the present invention.

Referring again to FIG. 10, which further illustrates a structural view of a capacitor according to a preferred embodiment of the present invention. As shown in FIG. 10, the capacitor includes a bottom electrode 16, a middle electrode 24 on the bottom electrode 16, a first dielectric layer 22 between the bottom electrode 16 and the middle electrode 24, a top electrode 40 on the middle electrode 24, and a second dielectric layer 38 between the middle electrode 24 and the top electrode 40.

Preferably, the bottom electrode 16 further includes a planar portion 18 and protruded portions 20 on the planar portion 18, and the middle electrode 24 includes H-shaped cross-sections 48 sitting on the protruded portions 20 of the bottom electrode 16. The second dielectric layer 38 is disposed on at least a sidewall of the middle electrode 24, and the top electrode 40 is disposed on and physically contacting the top surface of the bottom electrode 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor, comprising:
   a bottom electrode on a substrate;
   a middle electrode on the bottom electrode, wherein in a cross-section view, the middle electrode comprises a first H-shape, a second H-shape adjacent to the first H-shape, and a first horizontal portion connecting the first H-shaped and the second H-shape, wherein the first H-shape comprises two vertical portions and a second horizontal portion and the two vertical portions are orthogonal to a top surface of the substrate and a bottom surface of the first horizontal portion is substantially coplanar with a bottom surface of the two vertical portions;
   a first dielectric layer between the bottom electrode and the middle electrode, wherein the first dielectric layer fully covers a bottom surface of the second horizontal portion; and
   a top electrode on the middle electrode, wherein the bottom electrode has a flat bottom surface spanning entire width of the capacitor.

2. The capacitor of claim 1, further comprising:
   a second dielectric layer between the middle electrode and the top electrode.

3. The capacitor of claim 2, wherein the second dielectric layer is disposed on at least a sidewall of the middle electrode.

4. The capacitor of claim 2, wherein the second dielectric layer physically contacts the first dielectric layer.

5. The capacitor of claim 1, wherein the top electrode physically contacts the bottom electrode.

6. The capacitor of claim 1, further comprising a first contact plug physically connected to the middle electrode.

7. The capacitor of claim 1, further comprising a second contact plug physically connected to the top electrode.

8. The capacitor of claim 3, wherein the second dielectric layer is disposed on and directly contacting a sidewall of the middle electrode.

9. The capacitor of claim 1, wherein the top electrode covers one end of the middle electrode and not covering the other end of the middle electrode.

* * * * *